(12) United States Patent
Nomura

(10) Patent No.: US 12,249,483 B2
(45) Date of Patent: Mar. 11, 2025

(54) CHARGED PARTICLE BEAM WRITING METHOD AND CHARGED PARTICLE BEAM WRITING APPARATUS

(71) Applicant: NuFlare Technology, Inc., Yokohama (JP)

(72) Inventor: Haruyuki Nomura, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 394 days.

(21) Appl. No.: 17/929,145

(22) Filed: Sep. 1, 2022

(65) Prior Publication Data

US 2023/0107036 A1    Apr. 6, 2023

(30) Foreign Application Priority Data

Oct. 4, 2021    (JP) ................................ 2021-163581
May 24, 2022    (JP) ................................ 2022-084654

(51) Int. Cl.
  *H01J 37/317*    (2006.01)
  *H01J 37/302*    (2006.01)
  *H01J 37/304*    (2006.01)

(52) U.S. Cl.
  CPC ...... *H01J 37/3177* (2013.01); *H01J 37/3026* (2013.01); *H01J 37/304* (2013.01)

(58) Field of Classification Search
  CPC ... H01J 37/3177; H01J 37/3026; H01J 37/304
  See application file for complete search history.

(56) References Cited

U.S. PATENT DOCUMENTS

| 5,892,237 A | 4/1999 | Kawakami et al. |
| 5,912,096 A | 6/1999 | Hada |
| 10,337,852 B1 | 7/2019 | Ache et al. |

(Continued)

FOREIGN PATENT DOCUMENTS

| JP | 6-36997 A | 2/1994 |
| JP | 9-251941 A | 9/1997 |

(Continued)

OTHER PUBLICATIONS

Korean Office Action issued Sep. 6, 2024 in Korean Application 10-2022-0126146, (with unedited computer-generated English translation), 4 pages.

*Primary Examiner* — Sean M Luck
(74) *Attorney, Agent, or Firm* — Oblon, McClelland, Maier & Neustadt, L.L.P.

(57) ABSTRACT

In one embodiment, a charged particle beam writing method includes transferring a substrate to a writing chamber of a charged particle beam writing apparatus by use of a transfer mechanism while maintaining each of the writing chamber and the transfer mechanism at a predetermined temperature, calculating correction amounts for charged particle beams based on correction data for charged particle beam irradiation positions each associated with a previously obtained elapsed time from a predetermined starting point in time of transfer of the substrate and the elapsed time at a point in time of irradiation with each of the charged particle beams, and applying the charged particle beams to positions corrected based on the calculated correction amounts for the charged particle beams to write a pattern on the substrate.

10 Claims, 3 Drawing Sheets

(56) References Cited

U.S. PATENT DOCUMENTS

| | | | |
|---|---|---|---|
| 10,410,830 B2* | 9/2019 | Nakayamada | H01J 37/3026 |
| 10,699,877 B2 | 6/2020 | Nomura et al. | |
| 2007/0103659 A1 | 5/2007 | Yoshitake et al. | |
| 2018/0090298 A1* | 3/2018 | Nakayamada | H01J 37/1472 |
| 2020/0389940 A1 | 12/2020 | Song | |

FOREIGN PATENT DOCUMENTS

| | | |
|---|---|---|
| JP | 10-261565 A | 9/1998 |
| JP | 2012-119484 A | 6/2012 |
| JP | 2019-201111 A | 11/2019 |
| KR | 2002-0005414 A | 1/2002 |

* cited by examiner

CHARGED PARTICLE BEAM WRITING METHOD AND CHARGED PARTICLE BEAM WRITING APPARATUS

CROSS REFERENCE TO RELATED APPLICATION

This application is based upon and claims benefit of priority from the Japanese Patent Application No. 2021-163581, filed on Oct. 4, 2021, and the Japanese Patent Application No. 2022-84654, filed on May 24, 2022, the entire contents of which are incorporated herein by reference.

FIELD

The present invention relates to a charged particle beam writing method and a charged particle beam writing apparatus.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

In the case where the initial temperature of a mask at the start of writing differs from an ambient temperature (temperature inside a writing chamber), the mask expands or shrinks until the mask acclimates to the ambient temperature. This causes pattern writing positions to be displaced. If writing is waited until the mask transferred to the writing chamber acclimates to the ambient temperature and is then started, pattern writing position displacements can be avoided, but throughput will be reduced.

Typically, the temperature of a writing preparation chamber, such as a robot chamber in which a robot for handling a mask is installed, and the temperature of a writing chamber are adjusted by temperature control using constant temperature water so that the initial temperature of a mask transferred to the writing chamber is as close to the ambient temperature in the writing chamber as possible, thereby reducing soaking time (waiting time during which the mask is acclimated to the ambient temperature).

The temperature control using constant temperature water allows the temperature of each of the preparation chamber located on a transfer path and the writing chamber to be stabilized with a temperature difference (approximately ±0.03° C.) that is generally negligible relative to a writing accuracy. Assuming that the coefficient of thermal expansion of a quartz substrate typically used as a photomask is 5E−7, a maximum position error in a 6-inch photomask at a temperature difference of ±0.03° C. is approximately 0.5 nm (3.3E−2 ppm).

However, set resolutions of the temperature control using constant temperature water are limited. It is therefore difficult to completely eliminate the difference in absolute value between the temperature of the transfer path and the temperature of the writing chamber. Furthermore, heat transfer to a mask from a mask holding portion of a transfer robot causes an uneven temperature distribution in the mask. Such a temperature distribution cannot be eliminated by adjusting the temperature of constant temperature water. In writing with no soaking time, the above-described factors cause deformation of a mask, resulting in a reduction in positional accuracy.

DETAILED DESCRIPTION

In one embodiment, a charged particle beam writing method includes transferring a substrate to a writing chamber of a charged particle beam writing apparatus by use of a transfer mechanism while maintaining each of the writing chamber and the transfer mechanism at a predetermined temperature, calculating correction amounts for charged particle beams based on correction data for charged particle beam irradiation positions each associated with a previously obtained elapsed time from a predetermined starting point in time of transfer of the substrate and the elapsed time at a point in time of irradiation with each of the charged particle beams, and applying the charged particle beams to positions corrected based on the calculated correction amounts for the charged particle beams to write a pattern on the substrate.

Hereinafter, an embodiment of the present invention will be described based on the drawings.

Figure 1:
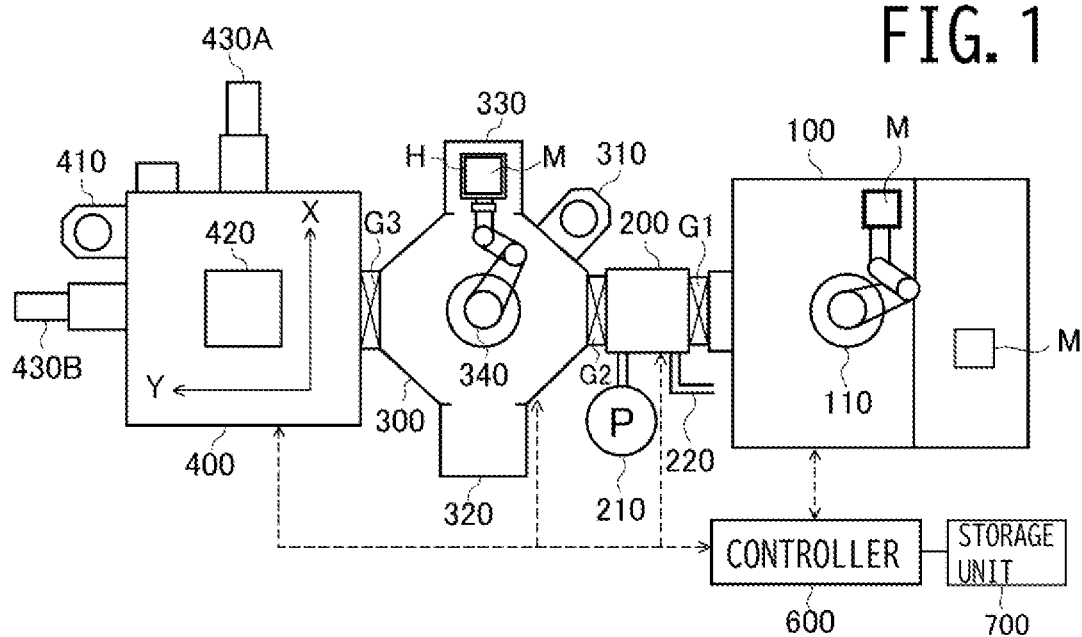
FIG. 1 is a plan view of an electron beam writing apparatus in an embodiment of the present invention.
Figure 2:
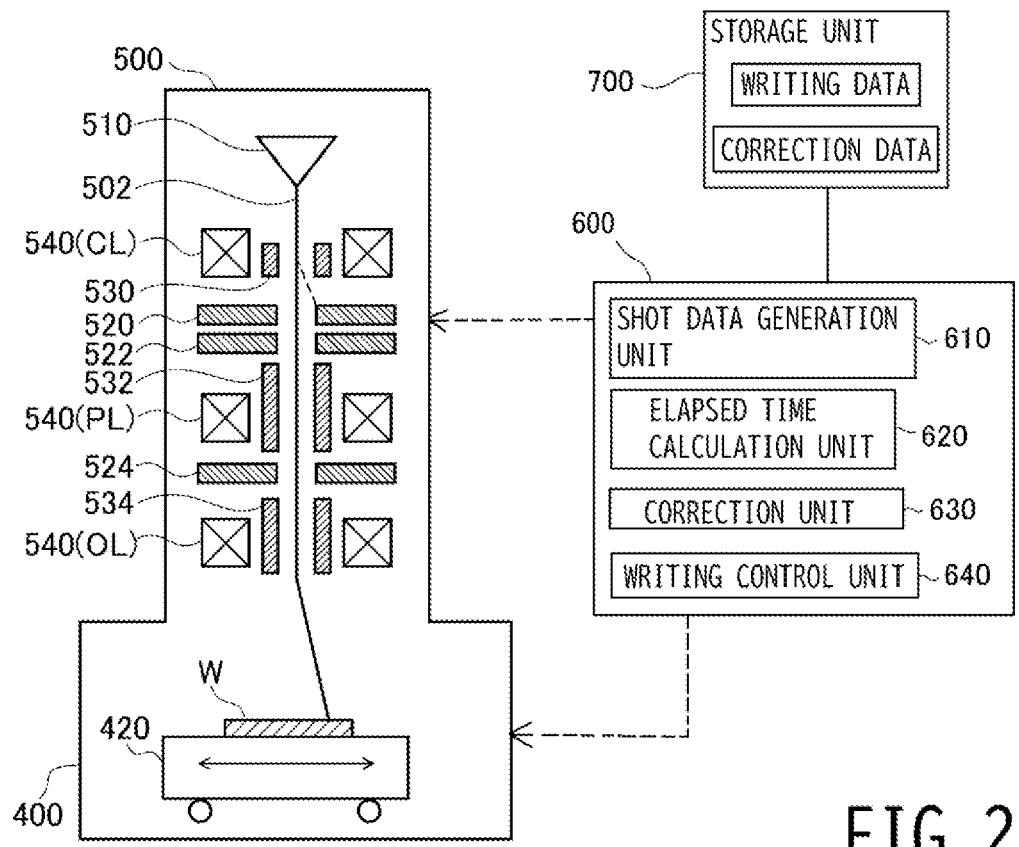
FIG. 2 is a schematic diagram illustrating the configuration of a writing mechanism.

FIG. 1 is a plan view of an electron beam writing apparatus in the embodiment of the present invention. FIG. 2 is a sectional view illustrating a writing chamber (W chamber) 400 and an electron beam column 500, which are included in the electron beam writing apparatus. As illustrated in FIGS. 1 and 2, the electron beam writing apparatus includes a substrate transfer system 100, an input/output (I/O) chamber 200, a robot chamber (R chamber) 300, the W chamber 400, the electron beam column 500, a controller 600, a storage unit 700, and gate valves G1 to G3. In FIG. 1, the depiction of the electron beam column 500 is omitted.

The storage unit 700 stores writing data, serving as layout data, inputted from the outside. The storage unit 700 stores correction data for correcting beam position displacements resulting from a change in shape of a mask substrate M. The correction data will be described later.

The substrate transfer system 100 includes a transfer arm 110, serving as a transfer mechanism, to transfer the mask substrate M. The substrate transfer system 100 receives the mask substrate M from the outside and transfers the substrate to the subsequent chamber while removing static electricity from the mask substrate M. Furthermore, the substrate transfer system 100 transfers the mask substrate M to the outside while removing static electricity from the mask substrate M subjected to writing.

The I/O chamber 200 is a load lock chamber for loading or unloading the mask substrate M into/from the R chamber 300 while the R chamber 300 is being maintained under vacuum (low pressure). The I/O chamber 200 includes a vacuum pump 210 and a gas supply system 220. The gate valve G1 is disposed between the I/O chamber 200 and the substrate transfer system 100. The vacuum pump 210, which is, for example, a dry pump or a turbo-molecular pump, evacuates the I/O chamber 200. The gas supply system 220 supplies vent gas (e.g., nitrogen gas or CDA) to the I/O chamber 200 when the I/O chamber 200 is vented to atmospheric pressure.

For evacuation of the I/O chamber 200, the vacuum pump 210 connected to the I/O chamber 200 is used to draw a vacuum within the I/O chamber 200. To return the I/O chamber 200 to the atmospheric pressure, the vent gas is supplied from the gas supply system 220 to the I/O chamber 200. Thus, the I/O chamber 200 is returned to the atmospheric pressure. When the I/O chamber 200 is evacuated or returned to the atmospheric pressure, the gate valves G1 and G2 are closed.

The R chamber 300 includes a vacuum pump 310, an alignment chamber 320, a mask cover receiving chamber 330, and a transfer arm 340. The R chamber 300 is connected to the I/O chamber 200 by the gate valve G2.

The vacuum pump 310 is, for example, a cryopump or a turbo-molecular pump. The vacuum pump 310 is connected to the R chamber 300, and draws a vacuum within the R chamber 300 to maintain a high vacuum condition. The alignment chamber 320 is a chamber for positioning (alignment) of the mask substrate M.

The mask cover receiving chamber 330 is a chamber that receives a mask cover H. The mask cover H is conductive and includes a picture-frame-shaped frame having a central opening and a plurality of grounding mechanisms arranged on the frame. The size of the frame is slightly larger than that of the mask substrate M. The mask cover H is used to drain away charge that accumulates on the mask substrate M due to irradiation with electron beams.

The transfer arm 340 transfers the mask substrate M between the I/O chamber 200, the alignment chamber 320, the mask cover receiving chamber 330, and the W chamber 400. Each of the transfer arm 340 in the R chamber 300 and the inside of the W chamber 400 is maintained at a predetermined temperature by thermostatic means (not illustrated) using constant temperature water, for example.

The W chamber 400 (writing chamber) includes a vacuum pump 410, an XY stage 420, a driving mechanism 430A, and a driving mechanism 430B. The W chamber 400 is connected to the R chamber 300 by the gate valve G3.

The vacuum pump 410 is, for example, a cryopump or a turbo-molecular pump. The vacuum pump 410, which is connected to the W chamber 400, draws a vacuum within the W chamber 400 to maintain a high vacuum condition. The XY stage 420 is a stage on which the mask substrate M is placed. The driving mechanism 430A drives the XY stage 420 in the X direction. The driving mechanism 430B drives the XY stage 420 in the Y direction. The controller 600 controls, for example, processes in the chambers and opening and closing of the gate valves.

As illustrated in FIG. 2, the electron beam column 500 includes electron beam irradiation means including an electron gun 510, a blanking aperture member 520, a first aperture member 522, a second aperture member 524, a blanking deflector 530, a shaping deflector 532, an objective deflector 534, and lenses 540 (a condensing lens (CL), a projection lens (PL), and an objective lens (OL)), and irradiates the mask substrate M placed on the XY stage 420 with an electron beam. The mask substrate M to be irradiated with an electron beam is covered with the mask cover H. In FIG. 2, the depiction of the mask cover H is omitted.

A variable-shaping type writing apparatus will be described below as an example. An electron beam 502, which is an example of a charged particle beam, emitted from the electron gun 510 is caused to illuminate evenly the first aperture member 522 having an aperture with a rectangular shape, for example, a square shape, through the condensing lens CL. The electron beam 502 is first shaped into a rectangle, for example, a square. The electron beam, serving as a first aperture image, passing through the first aperture member 522 is projected onto the second aperture member 524 through the projection lens PL. The position of the first aperture image on the second aperture member 524 is controlled by the shaping deflector 532, so that the beam can be changed in shape and size. The electron beam, serving as a second aperture image, passing through the second aperture member 524 is focused by the objective lens OL and is deflected by the objective deflector 534, so that the electron beam is applied to a desired position on the mask substrate M on the XY stage 420, which is movably disposed. The controller 600 controls, for example, application of a deflection voltage to the shaping deflector 532 and the objective deflector 534 and movement of the XY stage 420.

The blanking deflector 530 controls the electron beam 502 emitted from the electron gun 510 such that the electron beam passes through the blanking aperture member 520 in a beam ON state, and deflects the electron beam 502 in a beam OFF state such that the whole of the electron beam is blocked by the blanking aperture member 520. The electron beam passing through the blanking aperture member 520 for a period between the time when the beam OFF state is switched to the beam ON state and the time when the beam ON state is switched to the beam OFF state corresponds to a one-time electron beam shot. A dose of electron beam radiation per shot to the mask substrate M is adjusted depending on irradiation time for each shot.

The initial temperature of the mask substrate M transferred to the W chamber 400 does not match an ambient temperature (temperature in the W chamber 400). The mask substrate M expands or shrinks until the substrate acclimates to the ambient temperature. Expansion or shrinkage of the mask substrate M causes beam irradiation position displacements. A possible method includes causing a writing process to wait until the mask substrate M acclimates to the ambient temperature and then start. This method reduces throughput.

In contrast, according to the present embodiment, after the mask substrate M is transferred to the W chamber 400, the writing process is started immediately without any reduction in throughput, and the beam irradiation positions are corrected to reduce beam irradiation position displacements resulting from expansion/shrinkage of the mask substrate M.

Correction of the beam irradiation positions uses the correction data stored in the storage unit 700. The correction data is generated based on evaluation patterns written by a writing process, which is started immediately after an evaluation mask substrate is transferred to the W chamber 400.

Figure 3:
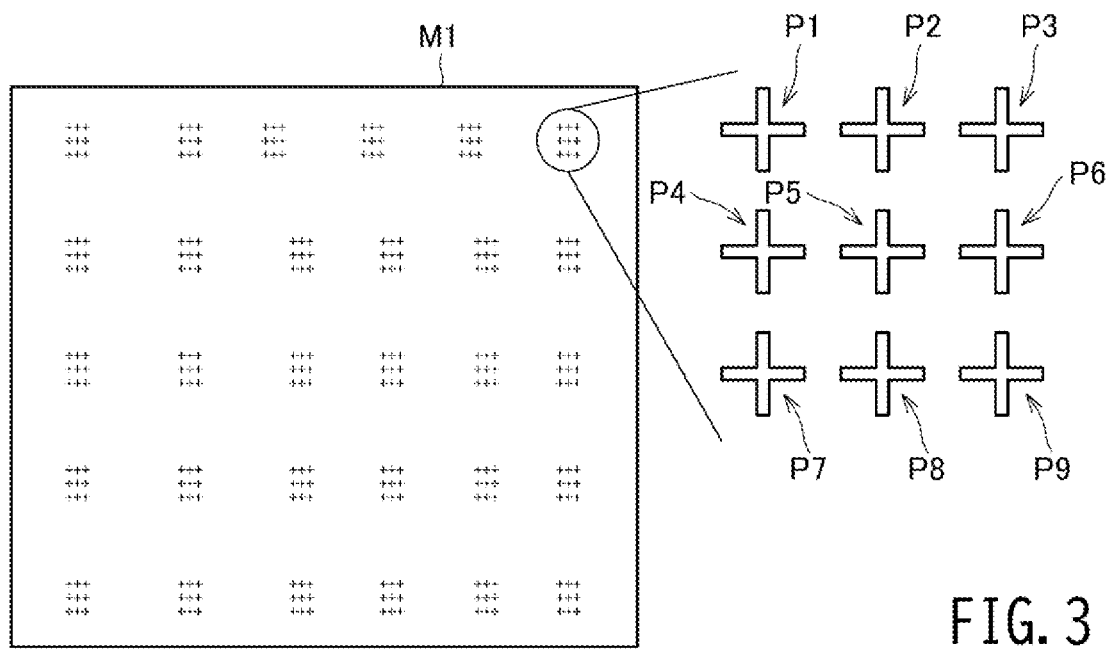
FIG. 3 is a diagram illustrating exemplary evaluation patterns.

For example, as illustrated in FIG. 3, a first evaluation pattern P1 is written on the entire surface of a mask substrate M1 for evaluation such that elements of the pattern P1 are sequentially written at predetermined intervals. A mask ID and an alignment mark are not written. Writing the first evaluation pattern P1 on the entire surface of the substrate is preferably completed within five minutes.

After the first evaluation pattern P1 is written on the entire surface of the mask substrate M1, a second evaluation pattern P2 is written on the entire surface of the substrate such that elements of the pattern are sequentially written. Writing the second evaluation pattern P2 is started immediately after completion of writing the first evaluation pattern P1. Each of the elements of the second evaluation pattern P2 is written in the vicinity of a corresponding one of the elements of the first evaluation pattern P1. The elements of the second evaluation pattern P2 are written in the same order as the order in which the elements of the first evaluation pattern P1 are written. Like writing the first evaluation pattern P1, writing the second evaluation pattern P2 on the entire surface of the substrate is preferably completed within five minutes.

Then, third to ninth evaluation patterns P3 to P9 are written on the entire surface of the substrate in the same manner. In parallel with the writing process of the first to ninth evaluation patterns P1 to P9, an elapsed time from transfer of the mask substrate M1 to the W chamber 400 is measured. The elapsed time is not limited to the elapsed time from the transfer of the mask substrate to the W chamber 400. An elapsed time from a predetermined starting point in time of transfer (event), such as transfer to the I/O chamber 200, may be measured.

The element of the first to ninth evaluation patterns P1 to P9 may have any shape. For example, a pattern of crosses is suitable for writing position measurement.

Figure 4A:
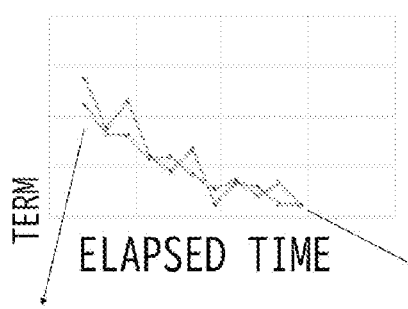
FIG. 4A is a graph illustrating a change with time in expansion/shrinkage term based on first-order shape fitting of position measurements of the evaluation patterns.
Figure 4B:
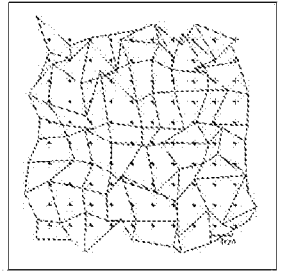
FIGS. 4B and 4C are diagrams illustrating position measurements.
Figure 4C:
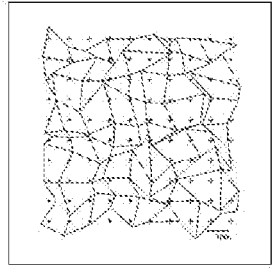

After the evaluation patterns are written, the mask substrate M1 is transferred to the outside and is then subjected to development and etching, thus forming the patterns. A position measuring device (not illustrated) is used to measure the writing positions of the first to ninth evaluation patterns P1 to P9. FIG. 4A illustrates a change with time in expansion/shrinkage term based on first-order shape fitting of measurements, FIG. 4B illustrates measurement results obtained just after transfer, and FIG. 4C illustrates measurement results obtained after a lapse of a predetermined period.

The measurement results are used to generate a correction map in which displacements of elements of an evaluation pattern written on the substrate from their ideal positions are mapped. The correction map is generated for each of the first to ninth evaluation patterns P1 to P9.

A combination of the correction map and an elapsed time, during which the evaluation pattern was written, from the transfer of the mask substrate M1 to the W chamber 400 is stored as correction data in the storage unit 700.

For example, it is assumed that the time when the mask substrate M1 was transferred to the W chamber 400 is reference time (t=0), writing start time of the first evaluation pattern P1 is t0, writing end time of the first evaluation pattern P1 is t1, writing end time of the second evaluation pattern P2 is t2, writing end time of the third evaluation pattern P3 is t3, . . . , and writing end time of the ninth evaluation pattern P9 is t9. For the correction data stored in the storage unit 700, a period of time from t0 to t1 is associated with the first correction map based on the measurement results of the writing positions of the first evaluation pattern P1.

Similarly, a period of time from t1 to t2 is associated with the second correction map based on the measurement results of the writing positions of the second evaluation pattern P2. A period of time from t2 to t3 is associated with the third correction map based on the measurement results of the writing positions of the third evaluation pattern P3. A period of time from t3 to t4 is associated with the fourth correction map based on the measurement results of the writing positions of the fourth evaluation pattern P4. A period of time from t4 to t5 is associated with the fifth correction map based on the measurement results of the writing positions of the fifth evaluation pattern P5. A period of time from t5 to t6 is associated with the sixth correction map based on the measurement results of the writing positions of the sixth evaluation pattern P6. A period of time from t6 to t7 is associated with the seventh correction map based on the measurement results of the writing positions of the seventh evaluation pattern P7. A period of time from t7 to t8 is associated with the eighth correction map based on the measurement results of the writing positions of the eighth evaluation pattern P8. A period of time from t8 to t9 is associated with the ninth correction map based on the measurement results of the writing positions of the ninth evaluation pattern P9.

The first to ninth correction maps may be stored as correction data in the storage unit 700. If position displacements are sufficiently small during generation of the correction maps, the correction maps generated by that point in time may be stored as correction data in the storage unit 700. Actual writing results do not need to be used without being processed. The writing results for a period of time from t1 to t9 may be fitted with an exponential function with a time constant $\lambda$, such as $\exp(-t/\lambda)$, to obtain $\Delta P^* \exp(-t1/\lambda)$, and the obtained $\Delta P^* \exp(-t1/\lambda)$ may be used as a map of correction values. Actual measurement results contain measurement noise, for example. The use of measurements fitted with an exponential function can improve correction accuracy, as compared with the use of measurement results without being processed.

Figure 5:
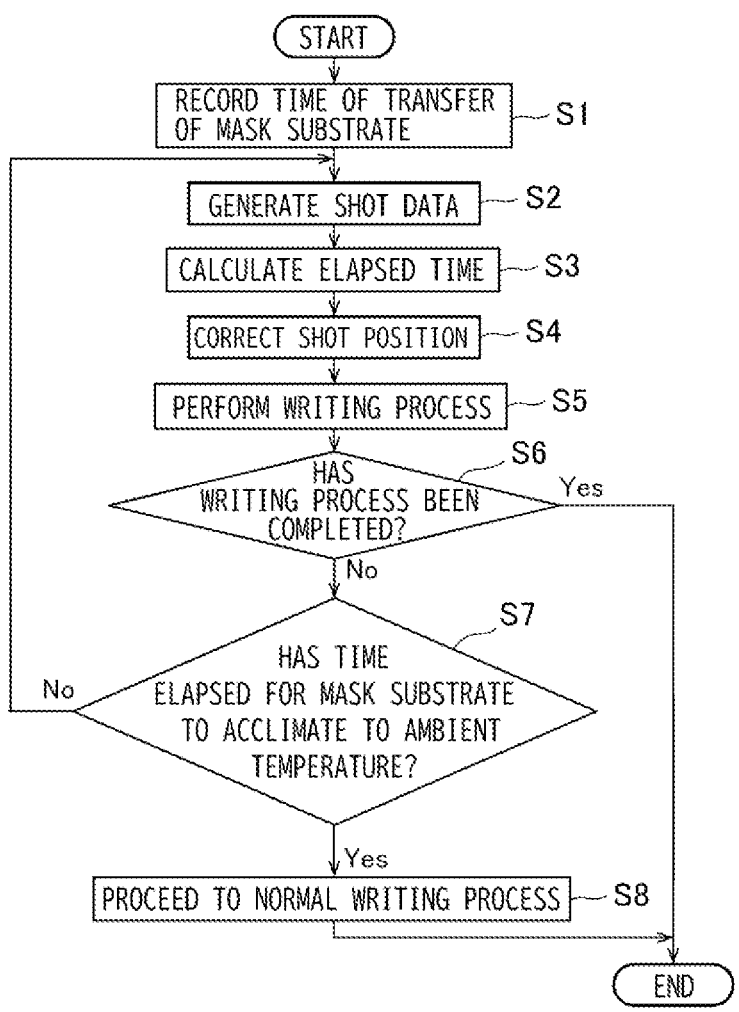
FIG. 5 is a flowchart illustrating a writing method according to the embodiment.

As illustrated in FIG. 2, the controller 600 includes a shot data generation unit 610, an elapsed time calculation unit 620, a correction unit 630, and a writing control unit 640. These units of the controller 600 may be implemented by hardware, such as electrical circuitry, or software. If the units are implemented by software, a program that achieves at least some functions of the controller 600 may be stored in a recording medium, and a computer including a CPU may be caused to read and execute the program. Examples of recording media include, but are not limited to, removable recording media, such as a magnetic disk and an optical disc, and fixed recording media, such as a hard disk drive and a memory. Processes by the units of the controller 600 will now be described with reference to a flowchart of FIG. 5.

The shot data generation unit 610 reads the writing data from the storage unit 700 and performs multi-stage data conversion on the writing data to generate shot data (step S2). The shot data contains information on, for example, a shot shape, a shot size, a shot position (irradiation position), and shot time.

The elapsed time calculation unit 620 records, as reference time, the time when the mask substrate M was transferred to the W chamber 400 (step S1) and calculates an elapsed time from the reference time at a point in time of beam irradiation for each shot (step S3).

The correction unit 630 corrects a shot position for each shot in the shot data with reference to a correction map associated with the elapsed time calculated by the elapsed time calculation unit 620 (step S4). For example, in the case where the calculated elapsed time Tk is t2<Tk<t3, the correction unit 630 corrects a shot position with reference to the third correction map in the storage unit 700. A known technique can be used to correct a shot position with a correction map. A shot position may be corrected by beam control. A shot position in the shot data may be corrected.

The writing control unit 640 controls an amount of deflection by each of the blanking deflector 530, the shaping deflector 532, and the objective deflector 534 so that the corrected shot position is irradiated with a beam, and performs a writing process (step S5).

If an enough time for the mask substrate M to acclimate to the ambient temperature has elapsed and an elapsed time from the transfer of the mask substrate exceeds a threshold value before completion of writing all patterns (No in step S6 and Yes in step S7), the process may proceed to a normal writing process involving no position correction based on the correction data (step S8).

As described above, according to the present embodiment, a group of correction maps of beam irradiation positions for changes with time in mask shape from the reference time when a mask substrate was transferred to the writing chamber are generated. During writing of actual patterns, a position is corrected with reference to a correction map associated with an elapsed time from transfer of a mask substrate. This reduces effects of expansion or shrinkage of the mask substrate resulting from a change in temperature and allows patterns to be written with high accuracy. In addition, there is no need for waiting until the mask substrate acclimates to the ambient temperature, so that the throughput does not decrease.

Heat transfer from the transfer arm 340 to a mask substrate causes an uneven temperature distribution in the mask substrate. The present embodiment eliminates the need for actual measurement of the temperature distribution and mask shape simulation based on the actual measurement.

In the above-described embodiment, a correction map in which position displacements for each grid are defined is used as correction data. A polynomial that approximates a position displacement on the surface of a mask may be calculated for each evaluation pattern, and factors of the polynomial may be stored as correction data in the storage unit 700. In this case, the correction unit 630 calculates a correction amount on the basis of a shot position and a factor associated with an elapsed time read from the storage unit 700. For example, factors $a1(t)$ to $a9(t)$ and $b1(t)$ to $b9(t)$ of the following polynomials are stored in the storage unit 700.

$$\Delta x(x,y) = a1^*x + a2^*y + a3^*x^2 + a4^*xy + a5^*y^2 + a6^*x^3 + a7^*x^2y + a8^*xy^2 + a9^*y^3$$

$$\Delta y(x,y) = b1^*x + b2^*y + b3^*x^2 + b4^*xy + b5^*y^2 + b6^*x^3 + b7^*x^2y + b8^*xy^2 + b9^*y^3$$

In the example of the above-described embodiment, the group of correction maps associated with the elapsed time from the transfer of the mask substrate to the writing chamber are prepared. In addition to the group of correction maps associated with the elapsed time, a group of correction maps associated with the number of times of alignment of the mask substrate (the total number of times of contact with the transfer arm 340) or the total alignment time (the total time of contact with the transfer arm 340) may be prepared because the number of times of alignment affects a temperature distribution in the mask substrate. The number of times of alignment is changed, the mask substrate is transferred to the writing chamber, the evaluation patterns are written, and a group of correction maps are generated based on writing results. Furthermore, a correction amount is calculated in consideration of the number of times of alignment.

For soaking in the I/O chamber 200 or the R chamber 300, correction data, such as a group of correction maps, associated with a soaking place and soaking time may be prepared.

The configuration using an electron beam as an example of a charged particle beam has been described in the above embodiment. Examples of the charged particle beam include, but are not limited to, an electron beam and a beam including charged particles, such as an ion beam.

Although the configuration using a single beam has been described in the above embodiment, a configuration may use multiple beams.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing method comprising:
transferring a substrate to a writing chamber of a charged particle beam writing apparatus by use of a transfer mechanism while maintaining each of the writing chamber and the transfer mechanism at a predetermined temperature;
calculating correction amounts for charged particle beams based on correction data for charged particle beam irradiation positions each associated with a previously obtained elapsed time from a predetermined starting point in time of transfer of the substrate and the elapsed time at a point in time of irradiation with each of the charged particle beams; and
applying the charged particle beams to positions corrected based on the calculated correction amounts for the charged particle beams to write a pattern on the substrate.

2. The method according to claim 1, wherein the correction data is further based on a total number of times of contact between the substrate and the transfer mechanism or a total time of contact between the substrate and the transfer mechanism.

3. The method according to claim 1, wherein in response to the elapsed time exceeding a threshold value, the pattern is written on the substrate without calculation of the correction amounts based on the elapsed time.

4. The method according to claim 1, further comprising:
transferring an evaluation substrate to the writing chamber;
sequentially writing n (n is an integer of 2 or more) evaluation patterns at different positions on a surface of the evaluation substrate such that a plurality of elements of a first evaluation pattern are written at predetermined intervals on the surface of the evaluation substrate and a plurality of elements of a second evaluation pattern are then written at predetermined intervals on the surface of the evaluation substrate; and
measuring positions of the sequentially written first to n-th evaluation patterns,
wherein the correction data is obtained based on a result of the measuring and an elapsed time from a predetermined starting point in time of transfer of the evaluation substrate to a point in time of writing of each of the first to n-th evaluation patterns.

5. The method according to claim 4, wherein the correction data contains a correction map that is generated for each of the first to n-th evaluation patterns based on the result of the measuring and in which position displacements of writing positions are mapped.

6. The method according to claim 5, wherein the correction map is generated by using values that are obtained by fitting the result of the measuring of each of the first to n-th evaluation patterns with an exponential function.

7. The method according to claim 4, wherein the correction data contains factors of a polynomial that approximates position displacements of writing positions calculated for each of the first to n-th evaluation patterns based on the result of the measuring.

8. A charged particle beam writing apparatus comprising:
a transfer mechanism transferring a substrate;
a writing chamber receiving the substrate transferred;
a thermostatic unit maintaining each of the writing chamber and the transfer mechanism at a predetermined temperature;
an elapsed time calculator calculating an elapsed time from a predetermined starting point in time of transfer of the substrate to the writing chamber;
a storage storing correction data for irradiation positions to be irradiated with charged particle beams, the irradiation positions being associated with the elapsed time obtained previously;
a corrector calculating correction amounts for the charged particle beams based on the correction data and the elapsed time at a point in time of irradiation with each of the charged particle beams; and
a writer applying the charged particle beams to positions corrected based on the calculated correction amounts for the charged particle beams to write a pattern on the substrate.

9. The apparatus according to claim 8, wherein the correction data is further based on a total number of times of contact between the substrate and the transfer mechanism or a total time of contact between the substrate and the transfer mechanism.

10. The apparatus according to claim 8, wherein in response to the elapsed time exceeding a threshold value, the pattern is written on the substrate without calculation of the correction amounts based on the elapsed time.

\* \* \* \* \*